United States Patent
Lin et al.

(10) Patent No.: US 6,961,013 B2
(45) Date of Patent: Nov. 1, 2005

(54) GUARANTEED MONOTONIC DIGITAL TO ANALOG CONVERTER

(75) Inventors: Heng-Chih Lin, Plano, TX (US); Chien-Chung Chen, Plano, TX (US); Solti Peng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/916,728

(22) Filed: Aug. 12, 2004

(65) Prior Publication Data

US 2005/0093729 A1 May 5, 2005

Related U.S. Application Data

(60) Provisional application No. 60/517,117, filed on Nov. 3, 2003.

(51) Int. Cl.[7] .................................................. H03M 1/12
(52) U.S. Cl. ...................................... 341/155; 341/145
(58) Field of Search ................................ 341/143, 144, 341/145, 155, 136, 153

(56) References Cited

U.S. PATENT DOCUMENTS

| | | | | |
|---|---|---|---|---|
| 5,949,362 A | * | 9/1999 | Tesch et al. | ................. 341/144 |
| 6,697,004 B1 | | 2/2004 | Galton et al. | |
| 2003/0201924 A1 | * | 10/2003 | Lakshmikumar et al. | ... 341/153 |

* cited by examiner

*Primary Examiner*—Peguy JeanPierre
*Assistant Examiner*—Joseph Lauture
(74) *Attorney, Agent, or Firm*—William B. Kempler; W. James Brady, III; Frederick J. Telecky, Jr.

(57) ABSTRACT

A hybrid Nyquist thermometer and sigma delta digital to analog converter is presented. The digital input signal is divided into most significant bits and least significant bits. The most significant bits are converted to a thermometer code. A thermometer element array is controlled by the thermometer code. A fractional value is calculated from the least significant bits and used to dither the first unexercised array element in order to get finer resolution with guaranteed monotonicity.

14 Claims, 2 Drawing Sheets

GUARANTEED MONOTONIC DIGITAL TO ANALOG CONVERTER

This application claims priority to provisional patent application Ser. No. 60/517,117, filed Nov. 3, 2003, entitled "Process Friendly, Guaranteed Monotonic DAC with Hybrid Nyquist and Sigma Delta Dithering Architecture," which application is incorporated herein by reference.

TECHNICAL FIELD

This invention relates generally to digital to analog converters, and more specifically to digital to analog converters with dithering.

BACKGROUND

Data converters, both digital-to-analog converters (DAC) and analog-to-digital converters (ADC), are ubiquitous in applications involving digital signal processing of real-world signals such as those found in communication systems, instrumentation, and audio and video processing systems.

Two major issues for DAC design are monotonicity and resolution. Monotonicity means that as the digital value becomes greater, the converted analog value must also become greater. Many DAC building blocks require guaranteed monotonicity with moderate clock rate and moderate design complexity. Examples include a DAC in a digitally controlled oscillator within the PLL loop, or a DAC in a digitally controlled crystal oscillator in an automatic frequency control loop. Matching between different DAC elements is usually required to guarantee monotonic behavior. With the process scaling, the physical size of the DAC elements becomes smaller, and it is therefore more difficult to control the size of the DAC elements, which must be matched to achieve monotonicity. As a result, the physical size of the DAC elements is limited by the matching requirement, thus the DAC does not benefit from the process scaling.

One type of DAC that has guaranteed monotonicity is a thermometer DAC. It is so named because it is similar to a mercury thermometer, where the mercury column always rises to the appropriate temperature and no mercury is present above that temperature. Typically, the input digital signal is binary and the binary code is converted to a thermometer code. The thermometer code is then used to control thermometer elements to generate an analog signal. For a thermometer DAC, elements are all of the same size, so that element matching becomes much simpler than in the binary case. Considering the transfer function, the thermometer converter is monotonic by design, since, when the input value increases, the bits change from 0 to 1 only. The requirement on element matching is also relaxed in the thermometer DAC and monotonicity is guaranteed.

Although the thermometer DAC has guaranteed monotonicity, the maximum resolution n of a thermometer DAC is limited by the capability to implement ($2^n-1$) identical unit devices. Published works show that even with modern technologies, it is very difficult to achieve resolutions higher than 12 bits due to the large amount of thermometer elements and the associated controlled signals. Unfortunately, this resolution is still too low for many applications.

Various methods have been designed to achieve higher resolutions. Each, however, has its limitations. For example, a Nyquist rate DAC has higher design and element matching complexity. A sigma delta DAC requires a much faster clock frequency for over sampling and quantization noise shaping. This element also requires analog filtering.

Typically, to achieve higher resolution, a hybrid scheme of hybrid Nyquist thermometer and sigma delta DAC is used. The resolution can be extended beyond the capability of the thermometer DAC. FIG. 1 illustrates a conventional hybrid Nyquist thermometer and sigma delta DAC. Node 16 outputs analog signals. Input node 2 receives digital input signals with bits. If n bits are all implemented by the thermometer DAC, the generated thermometer code has ($2^n-1$) bits so that ($2^n-1$) elements are required. In the hybrid scheme, the bits are divided into m most significant bits (MSB) named $4_{n-m}$ through $4_n$ and (n–m) least significant bits (LSB) named $4_0$ through $4_{n-m-1}$. The m most significant bits $4_{n-m}$ through $4_n$ are converted to thermometer code by a thermometer decoder 6. The thermometer code is used to control an element array 10 to generate an analog signal.

It is noticed that the value represented by the (n–m) LSB is always smaller than the value represented by the last bit of the MSB, or the bit $4_{n-m}$. Therefore, the value represented by the (n–m) least significant bits can be calculated as a fraction of the "whole" value of an element. The fractional value is typically converted to the analog signal by dithering a fixed and pre-determined thermometer element 14 that is substantially identical to other elements. Dithering the element 14 to a fractional value C means that when converting a fraction value, the element is turned on C of the time, and off (1–C) of the time, therefore, the analog output can have a value that is only a fraction of the "whole" value of an element.

The advantage of the hybrid DAC can be explained using an example. Assume a DAC with 14 bits resolution is desired. Since the 14 bits thermometer DAC requires $2^{14}-1$, or 16,383 elements, it is difficult to implement the DAC as a thermometer DAC. However, it is common to implement a 10 bits thermometer DAC. Therefore, the 14 bits digital signal can be divided as 10 bits MSB and 4 bits LSB. The smallest value represented by the MSB is 16, or binary 10000, while the greatest value represented by the 4 bits LSB is 15, or binary 1111. Therefore, the LSB always represents a fractional value of the MSB. For example, 00,0000,0001,0011 can be represented as 00,0000,0001+3/16. Converting such a digital signal to analog means turning on one thermometer element and dithering another element 3/16 of the time. With the hybrid scheme, only $2^{10}$, or 1024 thermometer elements are required. Therefore, the production cost is lowered and design is less complex.

Typically, dithering is performed on one dedicated element 14, as illustrated in FIG. 1. This requires element 14 to have very good matching with the other elements $10_1$ through $10_{2^m-1}$ in the DAC to guarantee monotonicity. However, the fractional value of the dithered element may not be smaller than the "whole" value of the thermometer DAC element, thus creating a non-monotonic DAC transfer function. In order to guarantee monotonicity, the matching between this dithered element and the rest of the DAC element needs to be so good that under all thinkable process, voltage, and temperature conditions, non-monotonicity will not occur. This matching requirement demands a certain physical size of DAC elements and prevents the DAC from having the benefit of process scaling.

SUMMARY OF THE INVENTION

A hybrid Nyquist thermometer and sigma delta digital to analog converter (DAC) is presented.

In accordance with one aspect of the present invention, a one-dimensional configuration is implemented. A digital input is divided into most significant bits and least significant bits. The most significant bits are converted to a thermometer code. A thermometer element array is controlled by the thermometer code to generate analog output. The least significant bits are used to calculate a fractional value and to dither the first unexercised array element to get finer resolution.

In accordance with another aspect of the present invention, a two-dimensional configuration is implemented. A digital input is divided into most significant bits and least significant bits. The most significant bits are further divided into row bits and column bits. A row thermometer code and a column thermometer code are generated from the row bits and column bits, respectively. A two-dimensional thermometer element array is controlled by the row thermometer code and the column thermometer code to generate analog output. The first unexercised element is dithered to get the fractional value calculated from the least significant bits.

The preferred embodiment of the present invention has a resolution that exceeds what a thermometer DAC is capable of achieving. Since no matching is required, the DAC elements can be scaled with the current technology. The DAC design using this architecture can be easily ported to different processes. The monotonicity is guaranteed without more matching requirements.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 3:
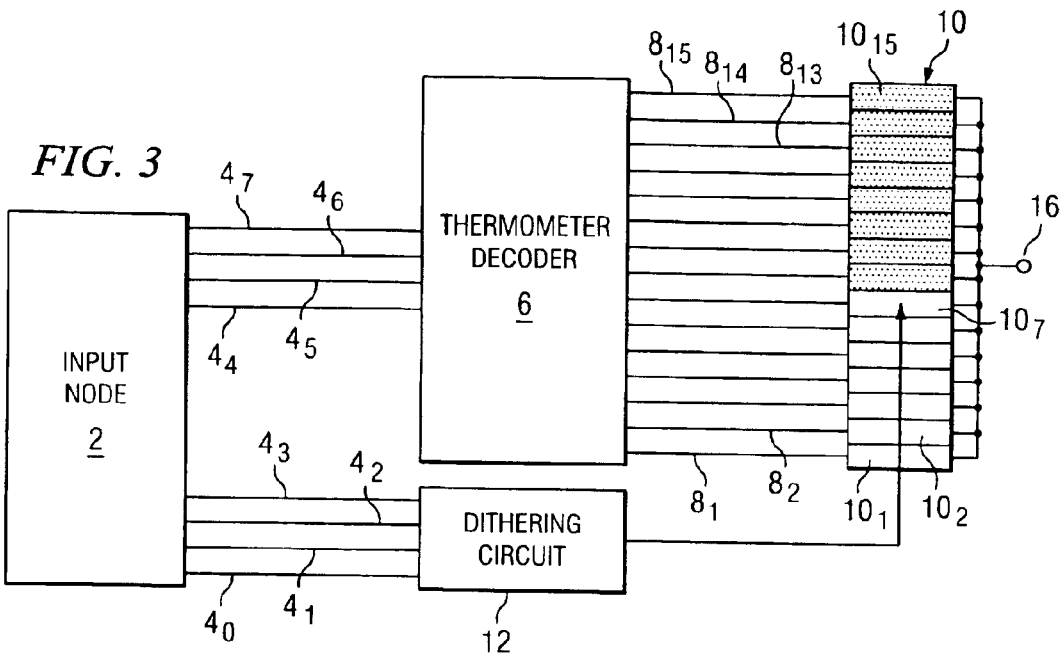
FIG. 3 illustrates a thermometer code scheme for digital inputs ranging from 1000,0000 to 1000,1111.
Figure 4:
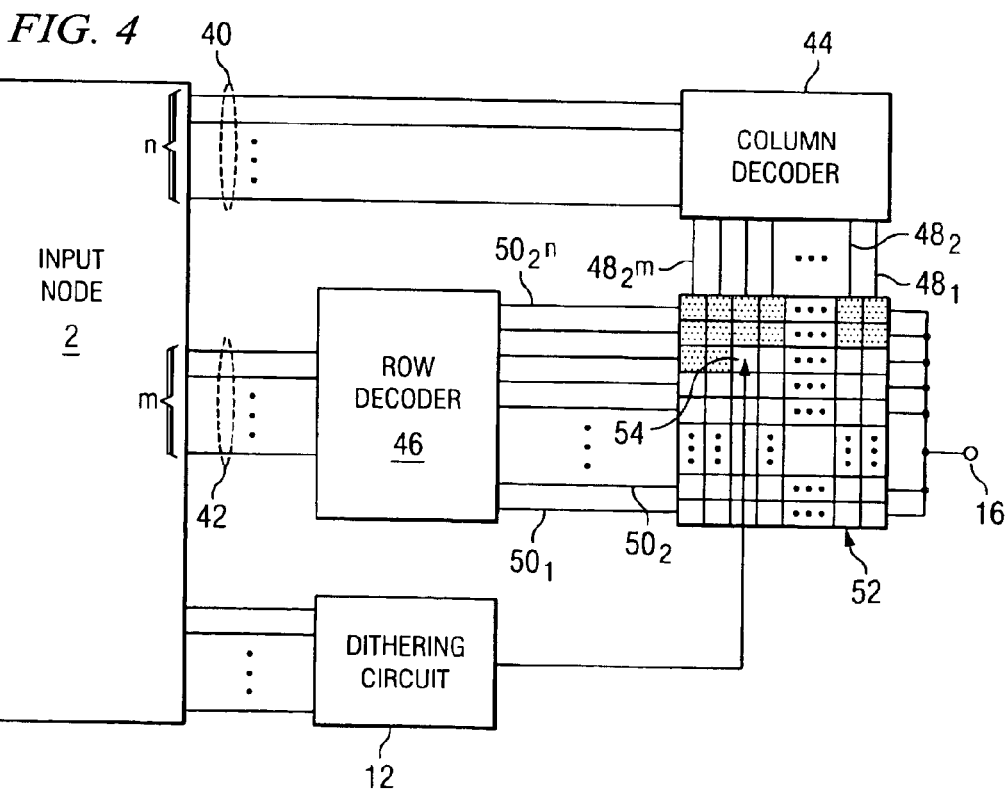
FIG. 4 illustrates a two-dimensional configuration of a preferred embodiment.

A preferred embodiment of the present invention presents a process-friendly, guaranteed monotonic digital to analog converter (DAC). It uses a hybrid Nyquist thermometer and sigma delta dithering architecture. A one-dimensional configuration and a two-dimensional configuration of a preferred embodiment are discussed. The preferred embodiments are illustrated in FIGS. 2 through 4 wherein like reference numbers are used to designate like elements throughout the various views and illustrative embodiments of the present invention.

Figure 1:
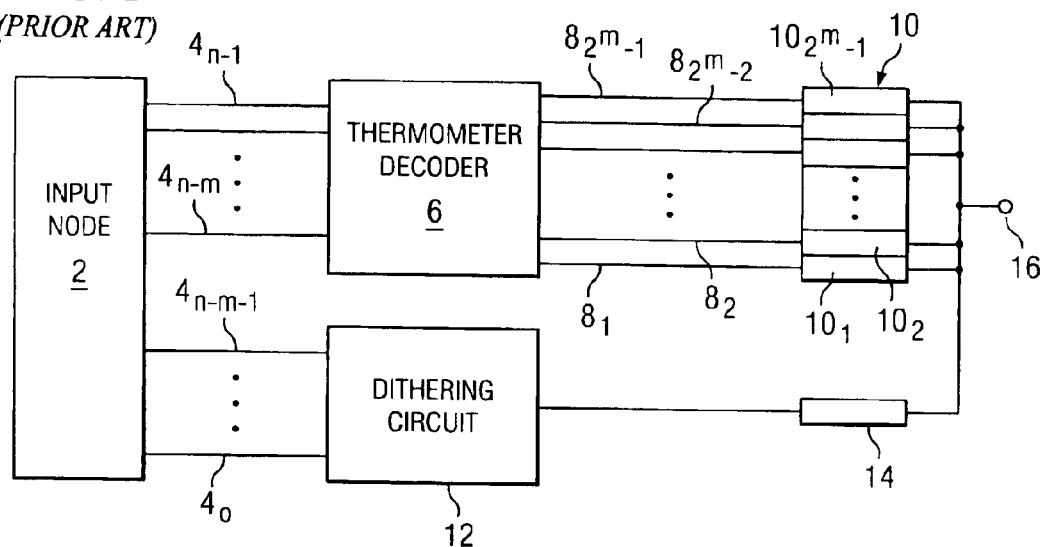
FIG. 1 illustrates a conventional hybrid Nyquist thermometer and sigma delta digital to analog converter.
Figure 2:
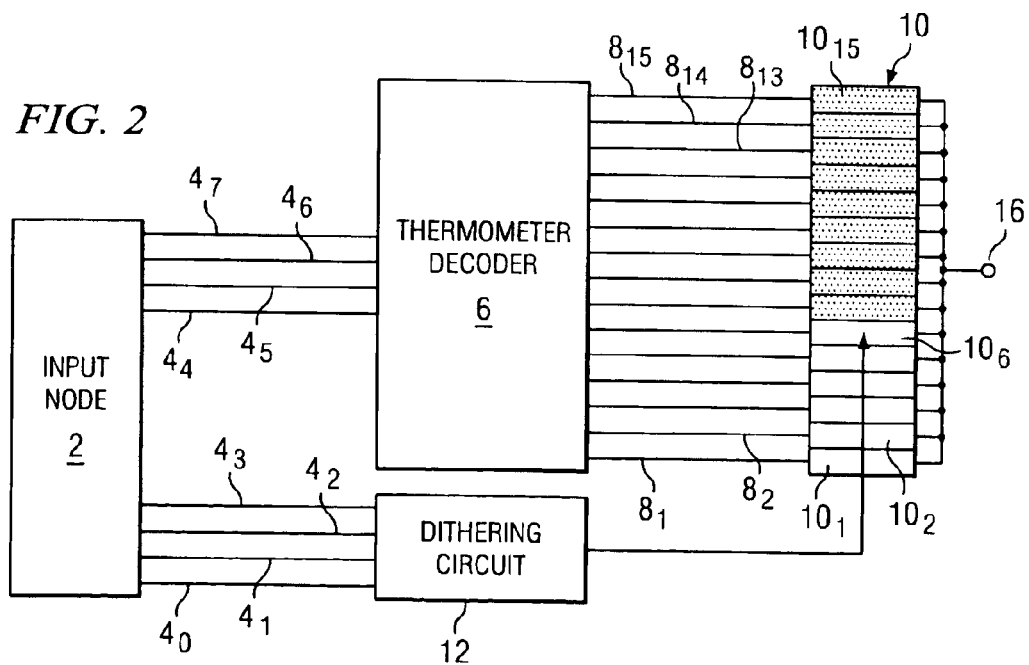
FIG. 2 illustrates a schematic diagram of a preferred embodiment.

FIG. 2 illustrates a schematic view of a preferred embodiment with a one-dimensional configuration. For simplicity, instead of showing a general case, FIG. 2 illustrates a configuration where the total bits n equals eight and the number of MSB m equals four. FIG. 1 can be referred to for the general case. It is understood that the number of bits in the MSB and LSB can vary depending upon the application.

Input node 2 receives a digital signal with n bits and output node 16 outputs an analog signal. The digital signal is separated into m most significant bits (MSB) ranging from $4_{n-m}$ through $4_n$ and (n−m) least significant bits ranging from $4_0$ through $4_{n-m-1}$. The most significant bits $4_{n-m}$ through $4_n$ are sent to a thermometer decoder 6 to generate a thermometer code 8 that is used to generate the analog output. The least significant bits $4_0$ through $4_{n-m-1}$ are calculated as a fractional value, which is used to dither an unexercised thermometer element to generate a fractional value.

In FIG. 2, the input digital signal is shown to have eight bits. Although it is rare to use a hybrid scheme for converting eight bits, it is easier to explain using an embodiment with fewer bits. There are various ways to separate eight bits into MSB and LSB. Eight bits may be separated into four MSB and four LSB, or six MSB and two LSB, or other ways as long as the total number of MSB and LSB is eight. Theoretically, the same analog output can be obtained even if the MSB and LSB are divided differently. How to divide is a design decision and is determined by factors such as the total number of bits, the accuracy of the dithering circuit and the analog circuit, etc. If the MSB is decreased by one and the LSB is increased by one, the same analog output can be obtained by doubling the analog output generated by each thermometer element.

In the example shown in FIG. 2, eight bits are divided into four MSB and four LSB. Four MSB corresponds to $2^4-1$, or 15 bits thermometer code, and the bits are denoted as $8_1$, $8_2, \ldots, 8_{15}$, where $8_{15}$ is the lowest bit that is always turned on first, and $8_1$ is the highest bit that is always turned on last. The elements that are turned on by the thermometer code are called exercised elements. Conversely, the elements that are not turned on by the thermometer code are called unexercised elements, and the element that is next to the exercised elements is called the first unexercised element.

Taking 0010,0011 as a digital input, 0010 is the MSB so that the thermometer code is 000,0000,0000,0011. This means elements $8_{15}$ and $8_{14}$ are 1s and elements $8_1$ through $8_{13}$ are 0s. Therefore, elements $10_{15}$ and $10_{14}$ are turned on and elements $10_1$ through $10_{13}$ are turned off. Element $10_{13}$ is the first unexercised element. Since the lowest value represented by the MSB is 10000 (binary), which is 16 (decimal), the fraction value of the LSB is the value of LSB divided by 16. Digital input 0010,0011 has a fraction value of 3/16. Combining the value converted from the MSB and the value dithered from the fractional value of the LSB, the analog signal can be obtained. Therefore, a digital code of 0010,0011 can be converted to an analog signal by turning on elements $d_{14}$ and $d_{15}$ and dithering another identical element 3/16 of the time.

In the prior art illustrated in FIG. 1, a dedicated element 14 is dithered to generate the fractional value. Element 14 needs to be substantially matched to each of the thermometer elements. This puts a limitation to the design and process of the DAC circuit. In the preferred embodiment, the fractional value is generated by dithering an unexercised element. It is preferred that the dithering be performed on the first unexercised element. Dithering the first unexercised element ensures that the dithering does not break monotonicity of the thermometer DAC.

The reason can be explained as such. If all LSB bits are 1s, an element will be dithered. If the digital input signal increases by 1, the LSB changes to all 0s, the previously dithered element will not be dithered and the first unexercised is turned on. Since the elements of the thermometer DAC do not need to be matched substantially, the previously dithered value may exceed the whole value of the first unexercised element. This creates non-monotonicity. However, if the first unexercised element is dithered, when the digital input signal increases by 1 and the LSB changes to all 0s, the state of the first unexercised element changes from dithered to "on". Since an element's dithered value cannot exceed its whole value, monotonicity is guaranteed.

An advantage of the preferred embodiment can be explained using an example. In the case of the prior art illustrated in FIG. 1, if the analog values generated by elements $10_1$ through $10_{15}$ are all b, and the dedicated element 14 generates an analog value of 1.2b, the digital input signal is 0001,1111, element $10_{15}$ is turned on, and the dedicated element 14 is dithered $15/16$ of the time. This generates as analog value of $1b+1.2b*15/16=2.125b$. If the input digit increases by 1 to 0010,0000, elements $10_{15}$ and $10_{14}$ are turned on, and the dedicated element 14 is not dithered. This generates an analog value of $b+b=2b$, which is lower than the analog value generated from 0001,1111. Therefore, the converter is not monotonic.

However, in the preferred embodiment of the present invention, assume the whole analog values generated by the thermometer elements $10_1$ through $10_{13}$ and $10_{15}$ are b, and the whole analog value of element $10_{14}$ is 1.2b. To convert a digital code of 0001,1111 into an analog signal, element $10_{15}$ is turned on and element $10_{14}$ is dithered $15/16$ of the time. This generates an analog value of $b+1.2b*15/16=2.125b$. If the digital input signal increases by 1 to 0010,0000, elements $10_{15}$ and $10_{14}$ will be turned on, and no element is dithered. This generates an analog value of $1.2b+b=2.2b$, so that monotonicity is preserved. From this example, it is realized that the preferred embodiment of the present invention relaxes the requirement of element matching.

A hybrid thermometer and sigma delta dithering DAC in the prior art requires matching between the dithered element and the other elements. The matching error cannot be greater than the smallest fractional value of the LSB. This matching requirement is related to the resolution of the LSB. The more bits the LSB has, the smaller the matching error that is allowed. For example, if the LSB has 4 bits, the matching error cannot exceed $1/16$. If the LSB has 6 bits, the matching error cannot exceed $1/64$. Therefore, this matching requirement is typically much stricter. The preferred embodiment of the present invention removes this matching requirement by dithering the first unexercised element. It is to be noted that it may still be preferred that the thermometer elements in the element array are substantially matched due to a linearity requirement. However, the matching requirement is much less restrictive in the preferred embodiment of the present invention.

FIG. 2 also illustrates a thermometer code scheme for a digital input signal ranging from 1001,0000 to 0101,1111. Since the MSB is 1001, elements $10_7$ through $10_{15}$, which are marked as shadowed, are turned on, it is preferred that the first unexercised element $10_6$ be dithered.

FIG. 3 shows another example. In particular, this figure illustrates a thermometer code scheme for a digital input ranging from 1000,0000 to 1000,1111. Since the MSB is 1000, elements $10_8$ through $10_{15}$, which are marked as shadowed, are turned on, it is preferred that element $10_7$ be dithered. However, with a stricter requirement of element matching to ensure that the DAC is monotonic, any of the elements $10_1$ through $10_6$ can also be dithered to generate the fractional value.

In another preferred embodiment, an extra thermometer element $10_{16}$ is added (not shown in FIG. 3). This is to handle the case in which all thermometer elements are turned on and there is no element left for dithering. For example, if the digital values are 1111,0000 through 1111, 1111, the MSB 1111 has reached the highest number it can be, so that all thermometer elements $10_1$ through $10_{15}$ are used, the LSB is 0010 so that a dithering of $2/16$ needs to be done, however, there is no element left for dithering and the fraction cannot be represented. In this case, an extra thermometer element $10_{16}$ is added. However, the final element $10_1$ never turns on fully. It is dithered $15/16$ of the time at most.

Dithering an element a fraction of the time may generate a pattern. In a time domain, this pattern means turning on and turning off an element periodically. In a frequency domain, this pattern generates frequency spurs at certain frequencies. The noise generated by turning an element on and off affects the authenticity of the signal. The noise may also affect the working of the circuit. The present embodiment uses sigma delta (SD) dithering to solve this problem. SD dithering removes the frequency spurs associated with periodical dithering. An element is still dithered the same percentage of the time, therefore, the same fractional value is obtained. However, the dithering is performed in a way that it appears to be random in a time domain. In a frequency domain, the noise generated by dithering appears as white noise. Therefore it has less affect on the output.

FIG. 4 illustrates a two-dimensional configuration of the present invention. The digital input has (n+m) MSB. The most significant bits are divided into m column bits and n row bits. The m column bits are sent to a column decoder 44 to generate a column thermometer code, which has $2^m$ bits. The n row bits are input into a row decoder 46 to generate a row thermometer code, which has $2^n$ thermometer bits. The row thermometer code and column thermometer code are used to control a two-dimensional thermometer element array 52 that has $2^n$ rows and $2^m$ columns. Since both rows and columns are controlled by the thermometer codes, an element will not be turned on before all of its lower row elements and column elements are turned on. The elements that are turned on are marked as shadowed. Element 54 is the first unexercised element. Similar to a one-dimensional configuration, any unexercised elements can be dithered to generate the fractional value of LSB. However, in order to guarantee monotonicity, it is preferred that the first unexercised element 54 be dithered.

Since the preferred embodiment has a relaxed matching requirement, it is more process-friendly. The DAC element can be scaled with the current technology. The layout is trivial since no matching is required. It can also be ported to different processes with guaranteed monotonicity.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of converting digital signal to analog signal, the method comprising:

dividing a digital input signal into most significant bits (MSB) and least significant bits (LSB);

generating a thermometer code from the MSB;

generating an analog signal by turning on the elements of an element array using the thermometer code, wherein elements turned on are exercised elements;

calculating a fractional value from the LSB;

dithering a first unexercised element of the element array using the fractional value to generate a fractional analog signal; and generating a combined analog signal from the analog signal and the fractional analog signal.

2. The method of claim 1 wherein dithering the unexercised element comprises performing sigma delta dithering.

3. The method of claim 1 wherein the thermometer array has elements that substantially match the dithered element.

4. The method of claim 1 wherein the thermometer code controls a thermometer element array having elements that do not substantially match the dithered element.

5. A method of converting digital code to analog signal, the method comprising:

dividing a digital input signal into most significant bits (MSB) and least significant bits (LSB);

dividing the MSB into row bits and column bits;

generating a row thermometer code from the row bits;

generating a column thermometer code from the column bits;

generating an analog signal from the row thermometer code and the column thermometer code, to exercise elements in an array addressed by the row bits and the column bits;

calculating a fractional value from the LSB;

dithering a first unexercised element using the fractional value to generate a fractional analog signal; and generating a combined analog signal from the analog signal and the fractional analog signal.

6. The method of claim 5 wherein dithering an unexercised element comprises performing sigma delta dithering.

7. The method of claim 5 wherein the thermometer code controls a thermometer element array having elements that substantially match the dithered element.

8. A hybrid digital to analog converter (DAC) comprising:

a digital input node having an MSB output node and an LSB output node;

a thermometer decoder coupled to the MSB output node of the digital input node;

a thermometer element array coupled to the thermometer decoder wherein elements in the thermometer array that are turned on by the thermometer decoder are exercised elements; and a dithering circuit coupled to the LSB output node and at least one element in the thermometer element array wherein the thermometer element array has a first unexercised element and the dithering circuit dithers the first unexercised element.

9. The hybrid DAC of claim 8 wherein the dithering circuit further comprises a fraction calculator.

10. The hybrid DAC of claim 8 wherein the dithering circuit comprises a sigma delta dithering circuit.

11. The hybrid DAC of claim 8 wherein the thermometer element array has elements and the elements are substantially matched.

12. The hybrid DAC of claim 8 wherein the thermometer element array has elements and the elements are not substantially matched.

13. The hybrid DAC of claim 8 wherein the thermometer decoder comprises a row thermometer code decoder and a column thermometer decoder and wherein the thermometer array is a two-dimensional array having rows controlled by the row thermometer decoder and columns controlled by the column thermometer decoder.

14. A digital to analog converter comprising:

means for dividing a digital input signal into most significant bits (MSB) and least significant bits (LSB);

means for generating a thermometer code from the MSB;

means for exercising elements in an arrangement of elements based on the thermometer code from the MSB;

means for dithering a first unexercised element using a fractional value that is based on the LSB; and means for generating an analog signal that is based on an output of the means for generating a thermometer code and an output of the means for dithering.

* * * * *